(12) United States Patent
El-Ghoroury et al.

(10) Patent No.: US 11,495,714 B2
(45) Date of Patent: Nov. 8, 2022

(54) DEVICE AND METHOD FOR III-V LIGHT EMITTING MICROPIXEL ARRAY DEVICE HAVING HYDROGEN DIFFUSION BARRIER LAYER

(71) Applicant: Ostendo Technologies, Inc., Carlsbad, CA (US)

(72) Inventors: Hussein El-Ghoroury, Carlsbad, CA (US); Kameshwar Yadavalli, Fremont, CA (US); Andrew Teren, Carlsbad, CA (US); Qian Fan, Carlsbad, CA (US)

(73) Assignee: Ostendo Technologies, Inc., Carlsbad, CA (US)

( * ) Notice: Subject to any disclaimer, the term of this patent is extended or adjusted under 35 U.S.C. 154(b) by 0 days.

(21) Appl. No.: 17/539,949

(22) Filed: Dec. 1, 2021

(65) Prior Publication Data

US 2022/0090266 A1 Mar. 24, 2022

Related U.S. Application Data

(62) Division of application No. 16/343,042, filed on Apr. 18, 2019, now abandoned.
(Continued)

(51) Int. Cl.
| | | |
|---|---|---|
| C23C 18/20 | (2006.01) |
| H01L 33/44 | (2010.01) |
| H01L 33/06 | (2010.01) |
| H01L 27/15 | (2006.01) |
| H01L 33/32 | (2010.01) |

(Continued)

(52) U.S. Cl.
CPC .......... *H01L 33/44* (2013.01); *C23C 18/2066* (2013.01); *H01L 27/156* (2013.01); *H01L 33/0093* (2020.05); *H01L 33/06* (2013.01); *H01L 33/12* (2013.01); *H01L 33/32* (2013.01); *H01L 33/382* (2013.01)

(58) Field of Classification Search
CPC ......... H01L 33/44; H01L 33/06; H01L 33/32; C23C 18/2066
See application file for complete search history.

(56) References Cited

U.S. PATENT DOCUMENTS 6,335,218 B1 * 1/2002 Ota .................. H01L 33/325
438/46
7,623,560 B2 11/2009 El-Ghoroury et al.
(Continued)

FOREIGN PATENT DOCUMENTS

CN 112567537 A 3/2021
EP 3807939 A1 4/2021
(Continued)

OTHER PUBLICATIONS

Eder, K., et al., "Absence of 'Threshold Effect' in Energy Loss of Slow Protons Traversing Large-Band-Gap Insulators," Physical Review Letters, Nov. 24, 1997, vol. 79, No. 21, pp. 4112-4115.
(Continued)

*Primary Examiner* — Nathan T Leong
(74) *Attorney, Agent, or Firm* — Greg Caldwell, Esq.; W. Eric Boyd, Esq.

(57) ABSTRACT

Solid state light emitting micropixels array structures having hydrogen barrier layers to minimize or eliminate undesirable passivation of doped GaN structures due to hydrogen diffusion.

7 Claims, 3 Drawing Sheets

Related U.S. Application Data

(60) Provisional application No. 62/684,106, filed on Jun. 12, 2018.

(51) Int. Cl.
  *H01L 33/38* (2010.01)
  *H01L 33/12* (2010.01)
  *H01L 33/00* (2010.01)

(56) References Cited

U.S. PATENT DOCUMENTS

| | | | |
|---|---|---|---|
| 7,767,479 | B2 | 8/2010 | El-Ghoroury et al. |
| 7,829,902 | B2 | 11/2010 | El-Ghoroury et al. |
| 8,049,231 | B2 | 11/2011 | El-Ghoroury et al. |
| 8,098,265 | B2 | 1/2012 | El-Ghoroury et al. |
| 8,243,770 | B2 | 8/2012 | El-Ghoroury et al. |
| 8,567,960 | B2 | 10/2013 | El-Ghoroury et al. |
| 2006/0049415 | A1 | 3/2006 | Liao et al. |
| 2009/0086170 | A1* | 4/2009 | El-Ghoroury ......... B82Y 20/00 353/38 |
| 2010/0150194 | A1 | 6/2010 | Tsuchiya et al. |
| 2010/0220042 | A1 | 9/2010 | El-Ghoroury et al. |
| 2012/0223307 | A1 | 9/2012 | Sakata |
| 2013/0001509 | A1 | 1/2013 | Fudeta et al. |
| 2013/0082236 | A1 | 4/2013 | Ramer et al. |
| 2013/0234110 | A1 | 9/2013 | Kato et al. |
| 2018/0277704 | A1 | 9/2018 | Bedell et al. |
| 2020/0318255 | A1 | 10/2020 | Lhuillier et al. |

FOREIGN PATENT DOCUMENTS

| | | |
|---|---|---|
| HK | 620210340993 | 6/2021 |
| IN | 202147001379 | 1/2021 |
| JP | 2012151261 A | 8/2012 |
| JP | 2020569065 | 12/2020 |
| KR | 20210030930 A | 3/2021 |
| TW | 202002326 A | 1/2020 |
| WO | 2019241159 A1 | 12/2019 |

OTHER PUBLICATIONS

Extended European Search Report for European Patent Application No. 19820351.5, dated Mar. 10, 2022, 10 pages.
International Preliminary Report on Patentability for International Patent Application No. PCT/US2019/036399, dated Dec. 24, 2020, 10 pages.
International Search Report and Written Opinion for International Patent Application No. PCT/US2019/036399, dated Oct. 4, 2019, 12 pages.
Jensen, T.R. et al., "Dehydrogenation kinetics of pure and nickel-doped magnesium hydride investigated by in situ time-resolved powder X-ray diffraction," International Journal of Hydrogen Energy, Apr. 17, 2006, vol. 31, pp. 2052-2062.
Munch, W., et al., "A quantum molecular dynamics study of proton conduction phenomena in $BaCeO_3$," Solid State Ionics, 1996, vol. 86-88, pp. 647-652.
Non-Final Office Action for U.S. Appl. No. 16/434,042, dated Dec. 16, 2020, 15 pages.
Notice of Allowance for U.S. Appl. No. 16/434,042, dated Aug. 5, 2021, 9 pages.
Pearton, S.J., et al.,"The Incorporation of Hydrogen into III-V Nitrides During Processing," Journal of Electronic Materials, 1996, vol. 25, No. 5, pp. 845-849.
Restriction Requirement for U.S. Appl. No. 16/434,042, dated Sep. 21, 2020, 7 pages.
Sheu, J.K., et al., "The doping process and dopant characteristics of GaN," Journal of Physics: Condensed Matter, 2002, vol. 14, pp. R657-R702.
Zhang, G.Q., et al., "More than Moore, Creating High Value Micro-Nanoelectronics Systems," 2009, pp. 1, 6, 8, 9, 20, 74, 279, 281, Springer Science+Business Media.

* cited by examiner

DEVICE AND METHOD FOR III-V LIGHT EMITTING MICROPIXEL ARRAY DEVICE HAVING HYDROGEN DIFFUSION BARRIER LAYER

CROSS REFERENCE TO RELATED APPLICATIONS

This application is a divisional of U.S. patent application Ser. No. 16/434,042, filed on Jun. 6, 2019, which in turn claims the benefit of U.S. Provisional Patent App. No. 62/684,106, filed on Jun. 12, 2018, the entirety of each disclosure of which is incorporated herein by reference.

TECHNICAL FIELD

The invention relates generally to light emitting devices and structures. More particularly, the invention relates to a III-V semiconductor light emitting device and structure comprising one or more hydrogen barrier layers for improved device performance.

The invention is applicable to the field of III-Nitride-based devices in general such as LEDs, micro-LEDs, and to CMOS integrated micro-LED array light emissive devices in particular. In one embodiment, devices and fabrication methods are disclosed that minimize or eliminate hydrogen diffusion into the doped GaN material in a light emitting device. The elimination or reduction of hydrogen exposure pathways in semiconductor light emitting structures beneficially enables stability of the doped GaN material itself. The reduction in hydrogen exposure in the instant invention enables improved device performance and device operation in the field.

BACKGROUND

Besides ordinary two-dimensional integrated circuit chips, three-dimensional or "3D" semiconductor integration enables improved performance of semiconductor integrated circuits (ICs) and enables increased functionality of Si-based IC platforms via the heterogeneous integration of different material layers (see G. Q. Zhang & A. J. van Roosmalen, "More than Moore: Creating High Value Micro/Nanoelectronics Systems", Springer). A non-limiting example of such a device is a CMOS/III-V integrated 3D micro-LED array emissive device referred to as a "Quantum Photonic Imager" display or "QPI®" display (see U.S. Pat. Nos. 7,623,560, 7,767,479, 7,829,902, 8,049,231, 8,243,770, 8,567,960). QPI® is a registered trademark of Ostendo Technologies, Inc., Applicant in the instant application.

Effectively, this class of emissive micro-scale pixel (i.e., micropixel) array imager devices is disclosed in, for instance, U.S. Pat. Nos. 7,623,560, 7,767,479, 7,829,902, 8,049,231, 8,243,770, 8,567,960, and 8,098,265, the contents of each of which is fully incorporated herein by reference.

The disclosed QPI display device desirably features high brightness, very fast multi-color light intensity and spatial modulation capabilities in a very small device configuration that includes all required image processing control circuitry. The solid state light- (SSL) emitting pixels of these disclosed devices may be either a light emitting diode (LED) or laser diode (LD), or both, having an on-off state managed by control circuitry contained within a CMOS controller chip (or device) upon which the emissive micro-scale pixel array of the QPI display imager is bonded and electronically coupled.

Sizing of the pixels comprising a QPI display may be in the range of approximately 5-20 microns with a typical chip-level emissive surface area being in the range of approximately 15-150 square millimeters. The pixels of the above emissive micro-scale pixel array display devices are individually addressable spatially, chromatically and temporally through the drive circuitry of its CMOS controller chip. The brightness of the light generated by such QPI imager devices can reach multiple 100,000 s cd/m2 at reasonably low power consumption.

Yet in such a device such as a QPI display, repeated hydrogen exposure during fabrication in the various material deposition runs and the release (i.e., desorption) of hydrogen from hydrogen-containing dielectrics in the device during thermal cycling can cause significant degradation of GaN-based light emitting devices. Among the most common detrimental results of hydrogen and thermal exposure during device fabrication is the unintended passivation of the doped GaN material in the light emitting structure itself. In addition, the p-contact and GaN interfacial layers may be affected negatively due to hydrogen.

What is needed is a device that is fabricated using processes and containing structures that mitigate or eliminate hydrogen exposure of the underlying GaN either during the deposition process or during thermal cycle or both (due to hydrogen release from hydrogen-containing dielectrics and processes).

BRIEF DESCRIPTION OF THE DRAWINGS

The embodiments herein are illustrated by way of example and not by way of limitation in the figures of the accompanying drawings in which like references indicate like or similar elements.

The matters defined in the description, such as detailed construction and elements, are provided to assist in an understanding of the exemplary embodiments. However, the present invention can be practiced without those specifically-defined matters. Also, well-known functions or constructions are not described in detail since they would obscure the invention with unnecessary detail. In order to understand the invention and to see how it may be carried out in practice, a few embodiments are described by way of non-limiting example only with reference to the accompanying drawings, in which.

DETAILED DESCRIPTION

Figure 1:
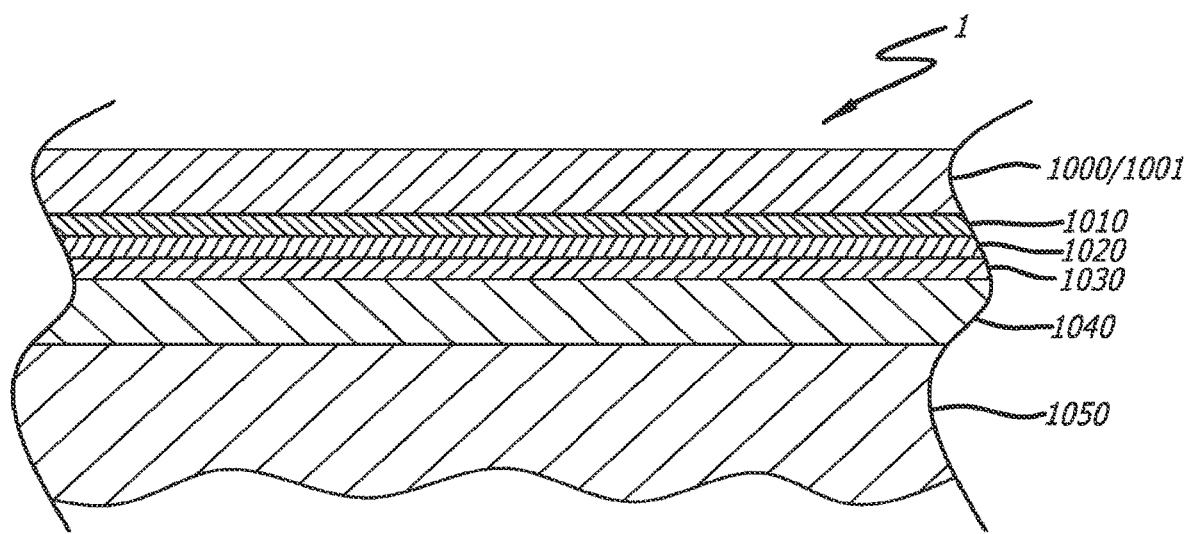
FIG. 1 illustrates a cross-section of the solid state light emitting material structure of the micropixel array of the invention showing the hydrogen barrier layer, the GaN diode structure, a buffer layer and an epitaxial growth substrate.

References in the following detailed description of the present invention to "one embodiment" or "an embodiment"

mean that a particular feature, structure, or characteristic described in connection with the embodiment is included in at least one embodiment of the invention. The appearances of the phrase "in one embodiment" in various places in this detailed description are not necessarily all referring to the same embodiment.

P-type doping in GaN material is most commonly achieved using Mg dopant atoms which are considered among the most effective dopants (see J. K. Sheu & G. C. Chi, "The doping process and dopant characteristics of GaN", J. Phys.: Condens. Matter 14 (2002) R657-R702). Typically, Mg dopants in MOCVD-grown GaN-based LED devices and structures are passivated by hydrogen during the epitaxial growth process. The MOCVD-grown structures then later require a post-growth high temperature anneal to activate the Mg dopants for effective device operation.

Detrimental hydrogen exposure by the GaN material of the diode structure can occur at multiple steps during the fabrication of a multilayer light emitting semiconductor device such as, for example, a micropixel array emissive device. The hydrogen incorporated during the growth/post-growth phase in the reactor itself is a major source of hydrogen exposure, but an additional source of hydrogen exposure is the hydrogen to which GaN-based materials or devices are exposed during subsequent device fabrication steps. For instance, a common semiconductor process step resulting in significant device hydrogen exposure is a well-known process known as "plasma enhanced chemical vapor deposition" ("PECVD") of dielectrics used in semiconductor manufacturing. Various other common semiconductor process steps also lead to hydrogen incorporation in III-V nitrides in general (see S. J. Pearton, R. J. Shul, R. G. Wilson, F. Ren, J. M. Zavada, C. R. Abernathy, C. B. Vartuli, J. W. Lee, J. R. Mileham & J. D. Mackenzie, "The incorporation of hydrogen into III-V nitrides during processing", J. Electron. Mater., 25, 845 (1996)).

The fabrication of GaN-based micropixel array emissive devices such as the QPI display device or other microLED devices often requires the deposition of dielectric layers such a silicon oxide ("$SiO_2$") passivation layer on the etched pixel sidewall or as an electrical isolation layer within the light emissive diode structure. Silicon oxide may also be used as an intermediary bonding layer in a multilayer semiconductor device comprising a plurality of semiconducting light emitting layers.

During the deposition of such silicon oxide layers, which is typically performed using plasma enhanced chemical vapor deposition (PECVD), the undesirable inclusion of excess hydrogen and/or hydroxyl (OH) groups is inevitable. At typical deposition temperatures of subsequently deposited silicon oxide layers, hydrogen that has become disassociated from previously deposited silicon oxide layers diffuses and causes undesirable passivation of the GaN doping, particularly p-type doping, within the diode structure. This in turn results in a reduction in GaN-based micropixel diode efficiency. This is even more problematic with silicon oxide layers that are in close proximity to the GaN layer of the light emissive micropixel diode structure.

In the typical fabrication of solid state light emitting diode material structures, hydrogen is used as a carrier gas for the epitaxial growth of the GaN material using, for instance, metal organic chemical vapor deposition (MOCVD). Since the hydrogen carrier gas flow remains in the chamber throughout the epitaxial growth process of the GaN-based material, there is often a high concentration of hydrogen in the layers of the GaN structure. When this GaN-based material is used in the fabrication of GaN-based solid state light emitting diode structures, the associated elevated processing temperatures of subsequent processing steps leads to diffusion of MOCVD residual hydrogen into the doped region of the diode structure material and detrimentally causes passivation of the dopants in the GaN material itself. This in turn, reduces the efficiency (IQE) of the GaN material comprising the diode structure and is particularly harmful to the p-doped region of the structure.

To address these concerns and other deficiencies in the prior art relating to GaN-based light emitting structures, in one aspect of the invention, a multilayer GaN-based III-Nitride light emitting micropixel array device is disclosed comprising one or a plurality of stacked light emitting layers wherein at least one of the light emitting layers comprises a hydrogen barrier layer.

The disclosure below describes a non-limiting embodiment of a method and structure of the invention that eliminates or significantly minimizes the detrimental effects of hydrogen diffusion during the fabrication process of GaN-based solid state light emitting diode structures and devices. The method includes the selected growth of one or a plurality of hydrogen barrier layers during the epitaxial growth of the GaN material and/or deposition of additional hydrogen barrier layers during the fabrication process of the GaN-based solid state light emitting diode structures.

FIG. 1 illustrates a cross-section of the solid state light emitting material structure of the micropixel array showing the hydrogen barrier layer 1000/1001, the GaN diode structure, a buffer layer and an epitaxial growth substrate. As illustrated in FIG. 1, the GaN-based diode structure may be comprised of a p-GaN layer 1010, one or more multiple quantum well active regions 1020, and an n-GaN layer 1030, all of which are deposited on a GaN buffer layer 1040 and an epitaxial growth substrate 1050. In the device illustrated in FIG. 1, the barrier layer (1000/1001) is either grown during epi-structure fabrication or deposited during device fabrication and acts as a "capping layer" over the GaN-based diode structure of FIG. 1.

In one embodiment, the hydrogen barrier layer 1000 may be a final layer that is deposited during the epitaxial growth of the light emitting structure 1. With this method, excess hydrogen carrier gas is isolated from the GaN-based diode structure by the deposited barrier layer 1000 which is designed to reduce the diffusion of excess hydrogen into the GaN-based diode structure. In an alternate embodiment, the barrier layer 1001 may be deposited during the fabrication process of the array of micropixel mesas. In another embodiment, both the epitaxially grown hydrogen barrier layers 1000 and the process-deposited barrier layer 1001 are used to realize further advantages as explained in the forthcoming description of the fabrication methods of these embodiments.

In the embodiment in which the barrier layer 1000 is epitaxially grown, the selected material of hydrogen barrier layer 1000 is preferably a material that is epitaxially compatible with the GaN material of the diode structure and preferably exhibits a band gap and crystalline properties that prevent or minimize the diffusion of hydrogen into the diode structure 1. A suitable hydrogen barrier 1000 material may comprise undoped GaN or aluminum nitride (AlN) or an alloy of these two materials. AlN is a member of the III-Nitride material group with GaN and as such is epitaxially compatible with the GaN material of the diode structure. Aluminum nitride has a wider band gap energy (6.2 eV) than GaN (3.4 eV). In general, the highly crystalline aspects of the epitaxially grown layer 1000, whether of GaN, AlN or an alloy of the two materials, serves to enhance their hydrogen diffusion properties.

A further suitable material for hydrogen barrier layer 1000 is an aluminum gallium nitride ($Al_xGa_{1-x}N$) material having a ratio of aluminum ($_x$) being selected to ensure the requisite barrier layer 1000 band gap energy necessary to form an effective barrier to block diffusion of hydrogen to the underlying GaN material.

An advantage of using ($Al_xGa_{1-x}N$) material for hydrogen barrier 1000 is to assist in balancing the lattice strain between the GaN diode layers and barrier layer 1000 through the appropriate selection of the aluminum ($_x$) ratio within the AlGaN material composition of barrier layer 1000. A further advantage of using AlGaN as barrier layer 1000 is to facilitate the ease of subsequent selective etching of barrier layer 1000 to deposit p-type and n-type contacts, or to access previously deposited p-type and n-type contacts on the underlying GaN material, again through the appropriate selection of the aluminum ($_x$) ratio within the AlGaN material composition of barrier layer 1000.

In the embodiment in which the barrier layer 1001 is process-deposited, the selected material of hydrogen barrier layer 1001 is a material that preferably exhibits properties that prevent or minimize the diffusion of hydrogen into the diode structure 1. In this embodiment, the hydrogen barrier layer 1001 may be an aluminum oxide ($Al_2O_3$) that may be deposited using sputtering (physical vapor deposition), PECVD or atomic layer deposition (ALD) techniques. The wider band gap energy of an $Al_2O_3$-based barrier layer (1001) effectively acts to block hydrogen diffusion through to the GaN diode structure. Another suitable material for the deposited hydrogen barrier layer 1001 is magnesium oxide (MgO). Magnesium oxide surface layers are known to retard hydrogen diffusion (see T. R. Jensen, A. Andreasen, T. Vegge, J. W. Andreasen, K. Stahl, A. S. Pedersen, M. M. Nielsen, A. M. Molenbroek & F. Besenbacher, "Dehydrogenation kinetics of pure and Ni-doped magnesium hydride investigated by in situ time-resolved powder X-ray diffraction", Int. J. Hydrog. Energy 31 (14), 2052-2062 (2006)). Another factor enabling the hydrogen barrier property of oxides is the strong bond between oxygen and hydrogen which is known to increase activation enthalpy for proton diffusion in oxides (see W. Munch, G. Seifert, K. Kreuer & J. Maier, Solid State Ionics, 88, 647-652 (1996)). Also, formation of molecular orbitals is shown to lead to blocking of slow hydrogen projectiles in large band-gap dielectric oxides (see K. Eder, D. Semrad, P. Bauer, R. Golser, P. Maier-Komor, F. Aumayr, M. Penalba, A. Arrau, J. M. Ugalde, & P. M. Echenique, "Absence of a "Threshold Effect" in the Energy Loss of Slow Protons Traversing Large-Band-Gap Insulators", Phys. Rev. Lett. 79 (21), 4112-4115, 1997).

Barrier layer 1000/1001 is preferably of a thickness of about 10 nm to about 50 nm to facilitate subsequent etching through barrier layer 1000/1001 for subsequent deposition of, or electrical access to, p-type or n-type contacts on the GaN surface. Barrier layer 1000/1001 may be up to 100 nm thick.

Figure 2:
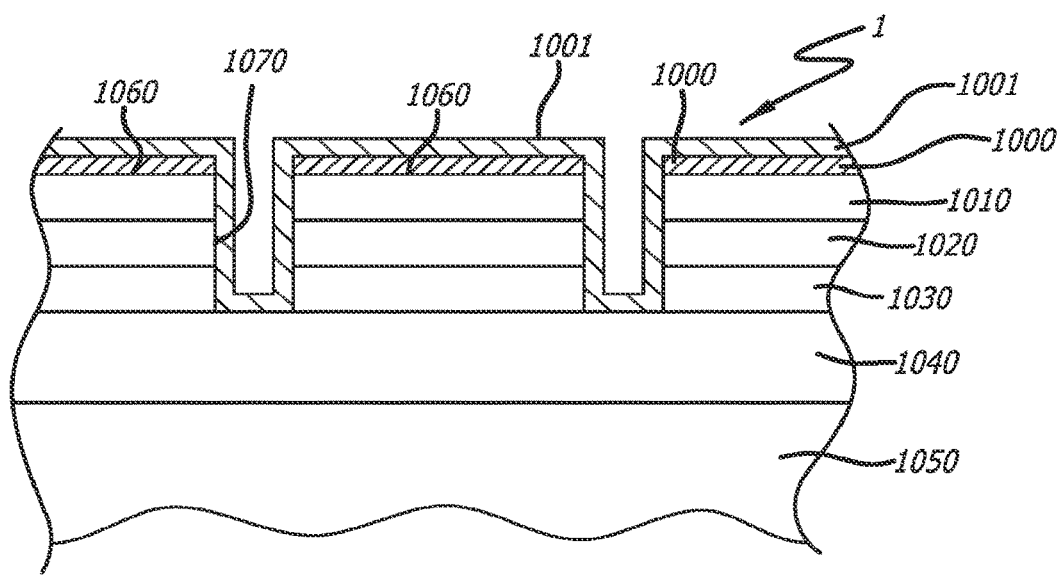
FIG. 2 illustrates a cross-section of a set of micropixel mesas comprising the solid state light emitting structure of FIG. 1 with the hydrogen barrier layer on the topside and sidewalls of the micropixels mesas.

In the method and device illustrated in FIG. 2, the hydrogen barrier layer 1001 is deposited during the processing of the GaN-based material during the fabrication process of the micropixel mesas 1060. In this method, the GaN-based material, which may be in wafer form, is first etched to form an array of micropixel mesas 1060. In this process, referred to as pixelation, the GaN material is etched, typically using plasma enhanced etching methods, to form trenches and sidewalls 1070 that physically isolate and form an array of micropixel mesas 1060.

It is expressly noted the illustrated fabrication methods and structures of the invention are not limited to the fabrication of devices comprising micropixel mesa structures 1060 and that the disclosed method and structure can be beneficially applied to any light emitting semiconductor structure where there is a risk of hydrogen diffusion passivating doping in its GaN-based diode structure, such as in a microLED or other solid state light emitting structure.

The micropixel separation sidewall 1070 spacing width in an embodiment of the micropixel mesa structure array of FIG. 1 is preferably a fraction of the micropixel mesa width. For example, for a nine (9) micron micropixel mesa width, the sidewall 1070 spacing width would preferably be about one (1) micron.

In order to electrically isolate micropixel diode mesas 1060 from the sidewall filling material, which may be a metal such as nickel, the micropixel sidewalls GaN surface is preferably first passivated with an industry-standard semiconductor dielectric material such as silicon oxide or silicon nitride. The hydrogen barrier layer 1001 material which may be deposited prior to deposition of passivation layer above also beneficially serves as a passivation layer for micropixel sidewalls 1070 in addition to providing a hydrogen diffusion barrier 1000. The added advantage of this method is that a hydrogen barrier 1001 function is provided on both the top side as well as the sidewalls 1070 of micropixel mesas 1060, thus avoiding diffusion of hydrogen to the GaN material potentially from sidewall passivation layers like silicon oxide or silicon nitride. In FIG. 2, both of the barrier layers 1000 and 1001 are illustrated.

In the described method, a barrier layer 1001 of high dielectric constant material is deposited, as illustrated in FIG. 2, on both the top side and the sidewalls 1070 of the micropixel mesas 1060. The barrier layer 1001 of high dielectric constant material may be aluminum oxide or aluminum nitride deposited using sputter deposition methods such as pulsed sputter deposition (PSD) or pulsed vapor deposition or atomic layer deposition (ALD).

The deposited barrier layer 1001, having a thickness ranging from about 10 nm to about 50 nm, may be etched on the top side of the micropixel mesas 1060 in order to deposit or access micropixel metal contact vias that are used to connect to metal contacts that are selectively deposited on the top side of the micropixel mesas 1060 prior to the deposition of hydrogen barrier layer 1001. The micropixel's metal contacts are designed to provide an unobstructed micropixel aperture area for the emitted light to emerge from the micropixel mesas 1060.

In one embodiment of the micropixel array hydrogen barrier device illustrated in FIG. 2, a regular passivation dielectric, silicon oxide or silicon nitride, for example, is deposited on the topside and sidewalls of the set of micropixel mesas comprising a solid state light emitting structure and the epitaxially grown (and patterned) hydrogen barrier layer 1000 provided over the topside of the micropixels mesas. In the embodiment of the device illustrated in FIG. 2, a regular passivation dielectric is used on the sidewalls and on top of grown hydrogen barrier layers 1000 on top of micropixel mesas. In another embodiment of the device illustrated in FIG. 2, a set of micropixel mesas is provided comprising a solid state light emitting structure and an epitaxially grown (and patterned) hydrogen barrier layer 1000 over the top side of the mesas combined with an additional deposited hydrogen barrier layer 1001 on the micropixel sidewalls and topside of the mesas.

Figure 3:
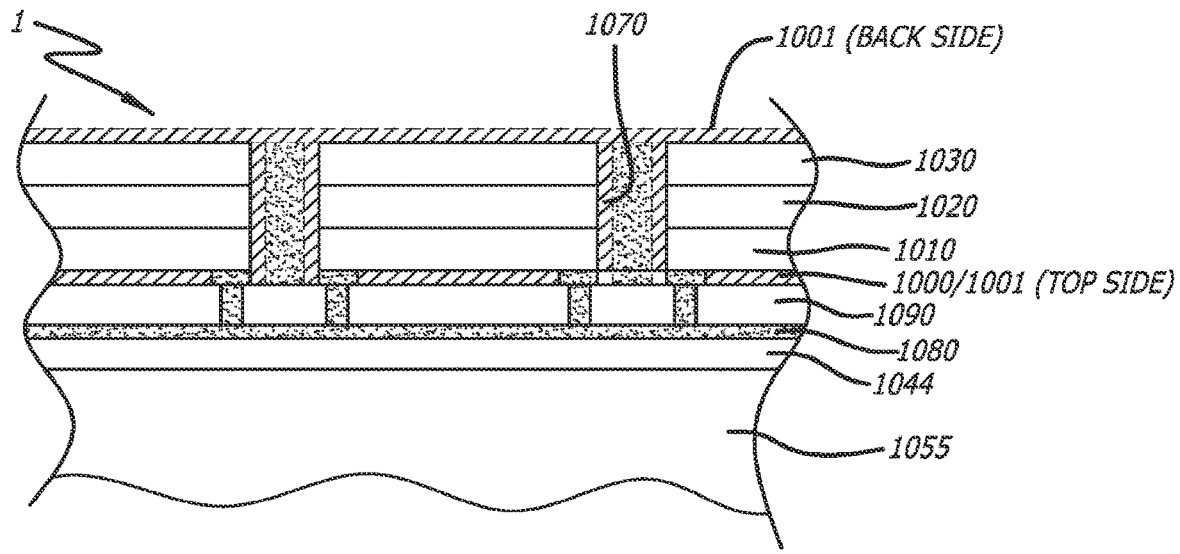
FIG. 3 illustrates a cross-section of a set of further processed micropixel mesas of FIG. 2.

FIG. 3 illustrates a cross-section of a set of the micropixel mesas of FIG. 2 which are further processed on the topside of the mesas and have topside contacts, vias, an interlayer dielectric layer (1090) and conductive electrical grid layers (1080). The micropixel device layer is bonded using an intermediary bonding layer (1044) to a carrier substrate (1055) with a subsequent release of the growth substrate, and thinning down of the buffer layer. As illustrated in FIG. 3, after the removal of growth substrate 1050 and GaN buffer 1040, barrier layer 1001 is deposited on the back side of the micropixel array that, together with barrier layer 1001 that is deposited on the topside and sidewalls 1070 of the micropixel array, fully encapsulates micropixel mesas 1060 within deposited barrier layer 1001. A similar process is applicable to the micropixel mesas of the various described embodiments related to FIG. 2.

Following the deposition of backside barrier layer 1001, the deposited barrier layer 1001 is etched, using wet or dry etching methods, to expose the metal contacts of the micropixel mesas' backsides that have been deposited prior to the deposition of back side barrier layer 1001. After the micropixel mesa backside metal contacts are exposed, metal vias may be deposited to make the micropixel mesa contacts electrically accessible on the surface of backside barrier layer 1001.

Referring to FIG. 3, the method therein of barrier layer 1001 deposition is useful to fully encapsulate micropixel mesas 1060 with a high dielectric constant barrier layer 1001 that prevents the leakage of hydrogen through either the topside or the sidewalls into the micropixel mesa 1060 diode structure and also to completely electrically isolate micropixel mesas 1060. In this method, dielectric barrier layer 1001 is deposited on the micropixel mesa 1060 backside after the micropixel array is first bonded to a carrier substrate (1051), then epitaxial growth substrate 1050 is removed, typically using a laser lift off (LLO) method and GaN buffer 1040 removed, using a combination of dry etching, lapping or chemical-mechanical polishing and wet etching methods.

Figure 4:
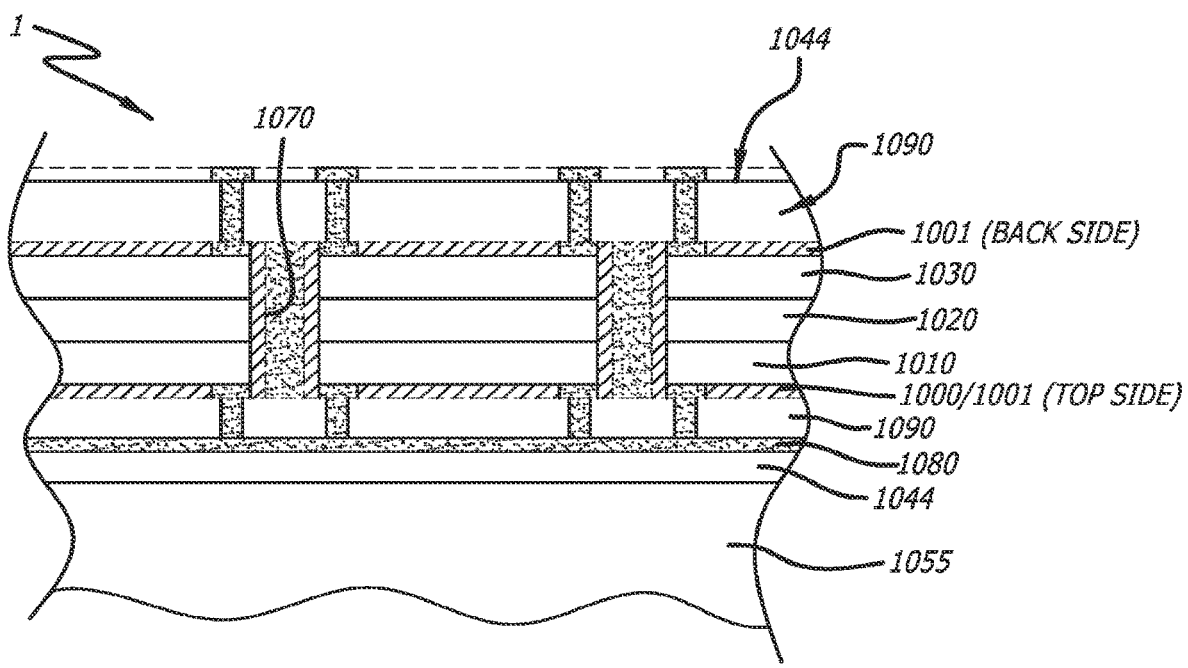
FIG. 4 is a cross-section of the fully encapsulated micropixel array multilayer structure of FIG. 3.

FIG. 4 illustrates the barrier layer's 1001 encapsulated micropixel array multilayer structure that can be sequentially bonded to either another micropixel array multilayer structure or to a CMOS controller substrate.

FIG. 4 also illustrates the micropixel barrier layer 1001 encapsulation at both the topside and backside of the micropixel array multilayer structure whereby the topside contact layer is dedicated to the common contact of the micropixel array and the backside contact layer is dedicated to the unique contacts of the multiplicity of micropixels comprising the array.

Referring to FIG. 4, in applications in which the micropixel array is sequentially bonded to, for instance, another micropixel array that emits a different color of light or to a digital CMOS controller substrate designed to control the micropixel array light modulation of color and intensity, an intermediary bonding layer 1044 may be deposited on the surface of backside barrier layer 1001. In this case, the through-barrier layer contact vias are extended through a deposited interlayer dielectric layer 1090 and are polished and the intermediary bonding layer 1044 is deposited to form a bonding surface for the coupling of light, electrical signals, or both, between the encapsulated micropixel array multilayer structures of the sequentially bonded device layers.

Figure 5:
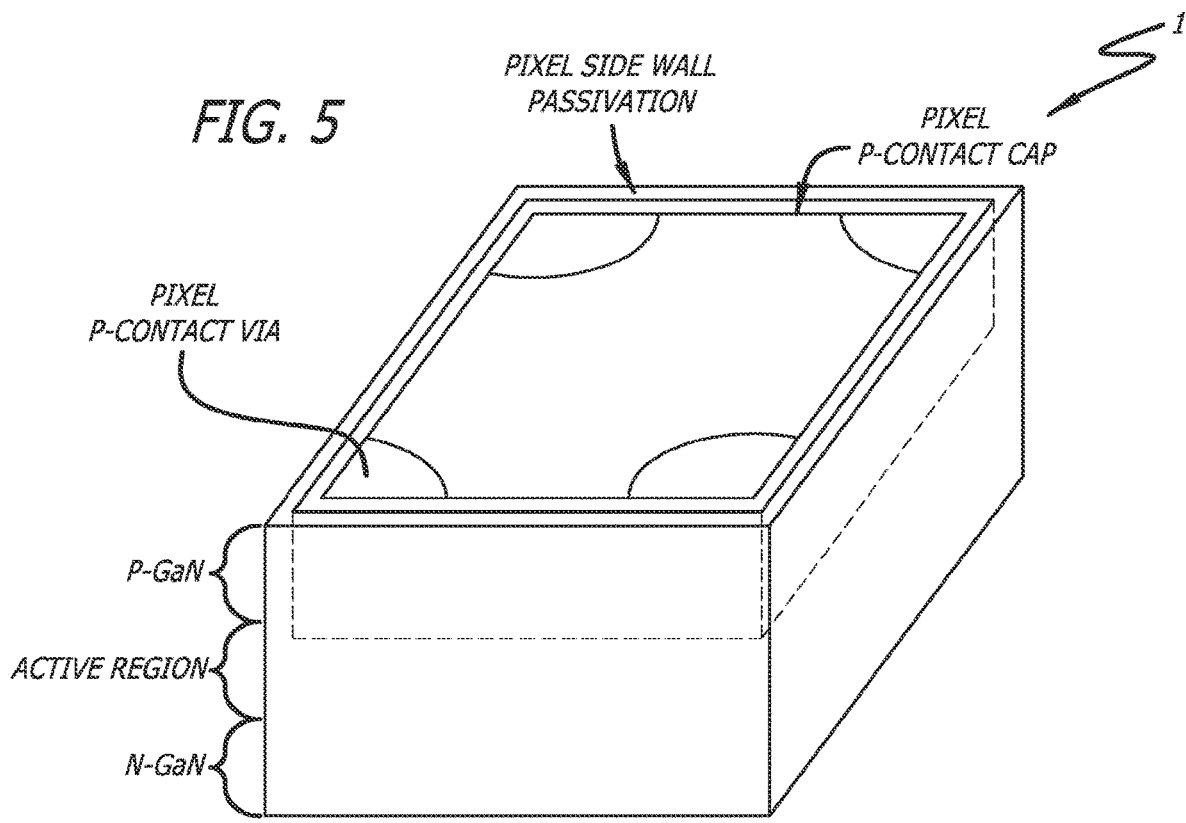
FIG. 5 illustrates a GaN-based light emitting micropixel structure comprising an as-grown hydrogen barrier layer, with other design elements that take advantage of the as-grown hydrogen barrier layer.
Figure 6:
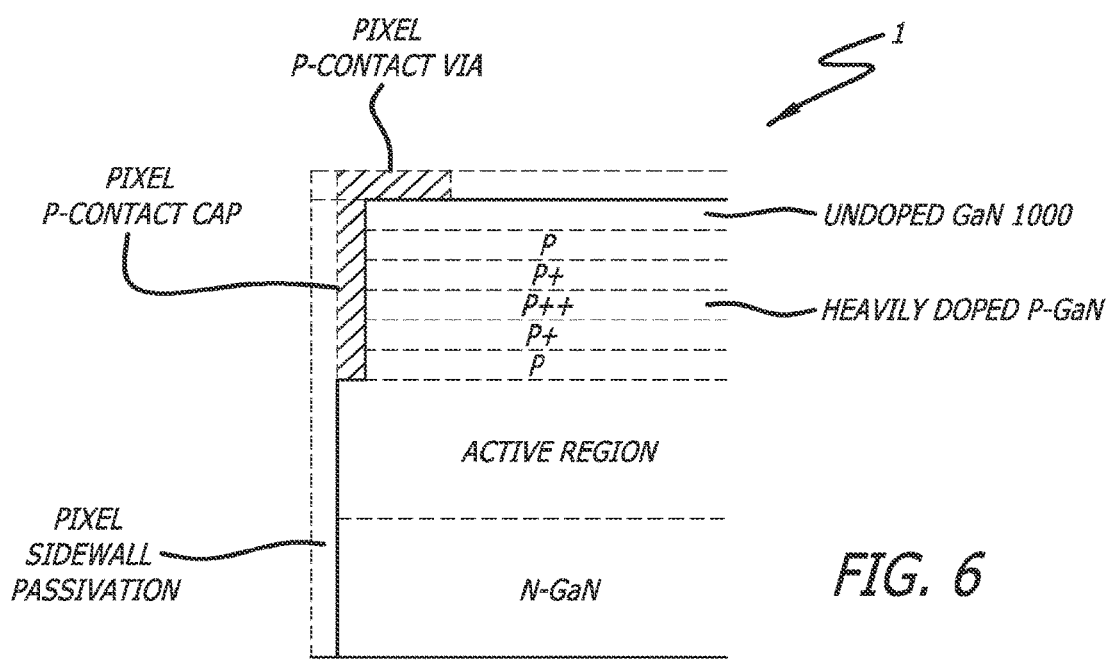
FIG. 6 illustrates a cross-section of the GaN-based light emitting micropixel structure of FIG. 5 showing further detailed features of the micropixel epi-structure.

FIG. 5 illustrates another embodiment of the GaN-based light emitting micropixel structure comprising as-grown hydrogen barrier layer 1000, shown in the micropixel cross sectional view of FIG. 6, with other features designed specifically to take advantage of the as-grown hydrogen barrier layer 1000. The micropixel design features include sidewall pixel p-contact cap and p-contact vias, with the pixel p-contact cap extending down into the p-GaN region of the micropixel epi-structure. A major benefit of these micropixel structure design features is that the p-doped regions are completely enveloped by either the grown hydrogen barrier 1000, or by pixel metal p-contact cap and p-contact via regions and thereby completely prevent hydrogen penetration into the hydrogen sensitive p-doped region of the micropixel structure.

An array of the barrier layer 1000 encapsulated micropixels of FIG. 5 can be bonded to another barrier layer 1000 encapsulated micropixel array that emits a different color of light at either the topside or the backside with the micropixel common contact layer as well as the micropixel unique contacts connected through their corresponding bonding layers through the sequentially bonded stack of micropixel arrays to ultimately be bonded as an integrated stack of layers to a CMOS control substrate. The light transparency characteristics of the barrier layers 1000 encapsulating the micropixels comprising the sequentially bonded micropixel arrays allow a clear micropixel aperture area transmittance of light emitted from each micropixel array multilayer to propagate through the bonded stack of micropixel array multilayers.

Referring to the barrier layer 1000 encapsulated micropixels of FIG. 6, in addition to passivating all four sides of the micropixel structure mesas 1060 and preventing hydrogen diffusion into the micropixel mesa's light emitting diode structure, the micropixel encapsulation barrier layer's 1000 high dielectric properties beneficially serve to electrically isolate the micropixel mesas 1060 from the electrical control signals coupled through the micropixel sidewalls 1070 and metal interconnect layers 1080 interposed within the bonded stack of micropixel arrays to create a single aperture multicolor micropixel array structure that is electrically coupled monolithically to its own micropixel color and brightness modulation control.

FIG. 6 provides a cross sectional view of the micropixel 1060 incorporating the aforementioned details of this embodiment. In the micropixel structure illustrated in FIG. 6, the hydrogen diffusion barrier is realized using an undoped GaN capping barrier layer 1000 that is deposited epitaxially as part of the GaN light emitting structure of device 1. Although the illustration shows undoped GaN is used as a hydrogen diffusion capping barrier layer 1000, other III-Nitride materials such as AlN, for example, can be used.

As illustrated in FIG. 6, the p-contact is not created on the top side of the p-GaN as is typically done and instead is created using a p-contact cap layer on the p-GaN portion of the pixel sidewall. With this design and method, the highly crystalline undoped GaN, or alternatively, AlN barrier layer 1000, which is epitaxially grown as a capping layer of the light emitting structure, acts as a hydrogen barrier while the p-contact metal cap ring layer surrounding the p-GaN region of the pixels functions as the p-contact metal for the pixel.

As is illustrated in FIG. 6, the p-contact metal ring is wrapped around the corners of the topside of the pixel to create a base for the pixel p-contact metal connection vias. The p-contact metal in this embodiment is created on the p-GaN region of the pixel sidewall thus leaving the top side of the pixel with a large, optically transparent GaN aperture area unobstructed by metal contact pads in order to achieve maximum light output while achieving a large p-metal contact area along the p-GaN region of the pixel sidewall. In FIG. 6, the depth of the pixel metal p-contact cap can be selected to various depths of the p-GaN region.

As illustrated in FIG. 6, the p-doping in the p-GaN region of the micropixel diode structure may be graduated, either continuously or stepped, from undoped GaN portion adjacent the pixel active region to p-GaN, to p$^+$-GaN, to p$^{++}$-GaN, to p$^+$-GaN, to p-GaN and finally to undoped GaN portion on the top-side of the p-GaN region whereby the thickness of the undoped GaN topside is selected to ensure creation of an effective hydrogen barrier, which preferably ranges in a thickness of about 10 nm to about 50 nm, but can be up to couple hundred nm.

The graduated doping of the p-GaN region together with the sidewall p-contact metal cap ensures efficient p-contact to the pixel p-GaN region while ensuring an effective barrier for blocking hydrogen diffusion into the pixel p-GaN region.

As illustrated in FIG. 6, the metal p-contact cap of the pixel is deposited on the p-GaN region of the pixel sidewall and wraps around the pixel corner to create a metal layer base that is used for depositing p-contact metal vias that connect the pixel p-contact cap to the micropixel array p-contact metal rail.

The p-contact of the micropixel cap is deposited on the p-GaN region of the pixel sidewall using standard semiconductor thin film deposition methods such as e-beam deposition or sputtering. The p-contact pixel cap is deposited on the p-GaN region of the pixel sidewall and may be comprised of at least two thin metal layers such as Ni, Au, Pt, or Pd (but not limited to these) with a thickness and function selected to achieve an ohmic contact between the p-contact cap and the p-GaN region of the pixel.

In a non-limiting example of a method for manufacturing the above structure, a GaN wafer is pixelated by etching the pixel sidewalls using standard III-V semiconductor processing methods and plasma-based dry etching in combination with appropriate wet etching to achieve the required pixel sidewall angle and surface smoothness. The etched sidewalls are passivated by means of the deposition of a thin dielectric layer of for instance, silicon oxide or silicon nitride, or a combination of both. The passivation layer is etched off the p-GaN region of the pixel sidewall and the ohmic p-contact cap metal layer deposited on the sidewall region. After deposition of the p-contact cap, the pixel sidewall is passivated again using a thin layer of silicon oxide, silicon nitride or both. After the pixel sidewall is passivated a second time, the remaining trenches of the sidewalls are filled with a metal such as tin or nickel (but not limited to these) which act to optically isolate the pixels and used as vias to interconnect the pixels with appropriate control signals.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by any claims in any subsequent application claiming priority to this application.

For example, notwithstanding the fact that the elements of such a claim may be set forth in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus, if an element can be understood in the context of this specification as including more than one meaning, then its use in a subsequent claim must be understood as being generic to all possible meanings supported by the specification and by the word itself.

The definitions of the words or elements of any claims in any subsequent application claiming priority to this application should be, therefore, defined to include not only the combination of elements which are literally set forth, but all equivalent structure, material or acts for performing substantially the same function in substantially the same way to obtain substantially the same result. In this sense, it is therefore contemplated that an equivalent substitution of two or more elements may be made for any one of the elements in such claims below or that a single element may be substituted for two or more elements in such a claim.

Although elements may be described above as acting in certain combinations and even subsequently claimed as such, it is to be expressly understood that one or more elements from a claimed combination can in some cases be excised from the combination and that such claimed combination may be directed to a subcombination or variation of a subcombination.

Insubstantial changes from any subsequently claimed subject matter as viewed by a person with ordinary skill in the art, now known or later devised, are expressly contemplated as being equivalently within the scope of such claims. Therefore, obvious substitutions now or later known to one with ordinary skill in the art are defined to be within the scope of the defined elements.

Any claims in any subsequent application claiming priority to this application are thus to be understood to include what is specifically illustrated and described above, what is conceptually equivalent, what can be obviously substituted and also what essentially incorporates the essential idea of the invention.

What is claimed is:

1. A multi-layer semiconductor light emitting structure comprising:
    a first region having a first composition;
    a second region having a second composition;
    at least one multiple quantum well active region between the first and second regions;
    at least one hydrogen barrier layer on the first region;
    a sidewall pixel contact cap that extends into the first region; and;
    a plurality of contact vias that electrically couple the sidewall pixel contact cap to a contact metal rail;
    wherein the first region is completely enveloped or encapsulated by either (i) the at least one hydrogen barrier layer, or (ii) by the sidewall pixel contact cap and the contact vias, thereby preventing or minimizing a hydrogen penetration into the first region of the multi-layer semiconductor light emitting structure.

2. The multi-layer semiconductor light emitting structure of claim 1, wherein the at least one hydrogen barrier layer is an undoped GaN capping barrier layer.

3. The multi-layer semiconductor light emitting structure of claim 1, wherein the at least one hydrogen barrier layer is of III-nitride material.

4. The multi-layer semiconductor light emitting structure of claim 1, further comprising:

a metal ring wrapped around corners of the topside of the multi-layer semiconductor light emitting structure to create a base for the contact vias;

whereby the topside of the multi-layer semiconductor light emitting structure comprises an optically transparent aperture area unobstructed by the contact vias in order to achieve maximum light output while achieving a large contact area along a sidewall of the first region.

5. The multi-layer semiconductor light emitting structure of claim 1, wherein doping of the first region is graduated, either continuously or stepped, from an undoped GaN portion adjacent to the at least one multiple quantum well active region to $p^+$-GaN, to $p^{++}$-GaN, to $p^+$-GaN, to p-GaN, and to an undoped GaN portion on the topside of the first region;

whereby the graduated doping of the first region effectively blocks hydrogen diffusion into the first region.

6. The multi-layer semiconductor light emitting structure of claim 1, wherein the sidewall pixel contact cap comprises at least two metal layers and a thickness selected to achieve an ohmic contact between the sidewall pixel contact cap and the first region.

7. The multi-layer semiconductor light emitting structure of claim 1, wherein thickness of the at least one hydrogen barrier layer is about 10 nanometer (nm) to about 50 nm.

* * * * *